(12) United States Patent
Yamaguchi et al.

(10) Patent No.: US 11,139,720 B2
(45) Date of Patent: Oct. 5, 2021

(54) DRIVE APPARATUS

(71) Applicant: Nidec Corporation, Kyoto (JP)

(72) Inventors: Yasuo Yamaguchi, Kyoto (JP); Takayuki Migita, Kyoto (JP); Yuki Ishikawa, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 16/323,269

(22) PCT Filed: Aug. 7, 2017

(86) PCT No.: PCT/JP2017/028550
§ 371 (c)(1),
(2) Date: Feb. 5, 2019

(87) PCT Pub. No.: WO2018/030323
PCT Pub. Date: Feb. 15, 2018

(65) Prior Publication Data
US 2019/0207479 A1 Jul. 4, 2019

Related U.S. Application Data

(60) Provisional application No. 62/372,411, filed on Aug. 9, 2016, provisional application No. 62/402,027, filed on
(Continued)

(30) Foreign Application Priority Data

Mar. 31, 2017 (JP) .............................. JP2017-071507

(51) Int. Cl.
H02K 9/19 (2006.01)
H02K 11/33 (2016.01)
(Continued)

(52) U.S. Cl.
CPC ................ *H02K 9/19* (2013.01); *H02K 5/20* (2013.01); *H02K 11/33* (2016.01); *H05K 7/20927* (2013.01)

(58) Field of Classification Search
CPC ..... H02K 9/193; H02K 9/197; H05K 7/20927
(Continued)

(56) References Cited

U.S. PATENT DOCUMENTS 7,977,830 B2 7/2011 Yoshida et al.
8,026,642 B2 9/2011 Hotta et al.
(Continued)

FOREIGN PATENT DOCUMENTS

JP 2009-118558 A 5/2009
JP 2011213290 A * 10/2011
(Continued)

OTHER PUBLICATIONS

Nakahara (JP 2015104290 A) English Translation (Year: 2015).*
(Continued)

*Primary Examiner* — Tulsidas C Patel
*Assistant Examiner* — Robert E Mates
(74) *Attorney, Agent, or Firm* — Keating & Bennett, LLP

(57) ABSTRACT

A drive apparatus includes a motor that includes a motor shaft disposed along a first central axis that extends in one direction a housing that includes a first housing portion housing the motor and that is capable of storing oil, a liquid cooling portion disposed in thermal contact with an inverter electrically coupled to the motor, the liquid cooling portion including a refrigerant liquid flowing therein, and a pipe portion connected to the liquid cooling portion, the refrigerant liquid inside the liquid cooling portion flowing in the pipe portion. The pipe portion passes inside the housing.

6 Claims, 10 Drawing Sheets

Related U.S. Application Data on Sep. 30, 2016, provisional application No. 62/439,201, filed on Dec. 27, 2016.

(51) Int. Cl.
*H02K 5/20* (2006.01)
*H05K 7/20* (2006.01)

(58) Field of Classification Search
USPC ....... 310/54, 58, 59, 60 A, 61, 57, 67 R, 64, 310/68 D
See application file for complete search history.

(56) References Cited

U.S. PATENT DOCUMENTS

| | | | |
|---|---|---|---|
| 8,148,859 | B2 | 4/2012 | Yoshida et al. |
| 2009/0267427 | A1* | 10/2009 | Yoshida ................ H02K 5/225 310/54 |
| 2010/0194219 | A1* | 8/2010 | Hotta .................... B60L 3/0061 310/54 |

FOREIGN PATENT DOCUMENTS

| | | |
|---|---|---|
| JP | 2013-055728 A | 3/2013 |
| JP | 5381872 B2 | 1/2014 |
| JP | 2015-104290 A | 6/2015 |
| JP | 2015104290 A * | 6/2015 |
| WO | 2014/135431 A1 | 9/2014 |

OTHER PUBLICATIONS

Sakaguchi (JP 2011213290 A) English Translation (Year: 2011).*
Yamaguchi et al., "Drive Apparatus", U.S. Appl. No. 16/323,268, filed Feb. 5, 2019.
Official Communication issued in International Patent Application No. PCT/JP2017/028550, dated Oct. 31, 2017.

* cited by examiner

DRIVE APPARATUS

BACKGROUND OF THE INVENTION

1. Field of the Invention

The present disclosure relates to a drive apparatus.

2. Description of the Related Art

A rotary electric machine including a case that stores a lubricating fluid that lubricates and cools a stator, a rotor, and the like is known.

In such a rotary electric machine described above, it is desirable that a temperature of the lubricating fluid is lowered by cooling the lubricating fluid supplied to the stator and the like so that the stator and the like are efficiently cooled. As a method of cooling the lubricating fluid supplied to the stator and the like, one can conceive of a method in which, for example, a cooling device is provided midway of an oil passage supplying the lubricating fluid stored in a case to the stator and the like and cooling the lubricating fluid with the cooling device.

However, with the above method, there are cases in which the lubricating fluid is not sufficiently cooled since the lubricating fluid is only cooled while passing through the cooling device. Furthermore, since the cooling device that cools the lubricating fluid needs to be provided separately, there is a problem in that the rotary electric machine becomes large in size.

SUMMARY OF THE INVENTION

A drive apparatus according to an example embodiment of the present disclosure includes a motor that includes a motor shaft disposed along a first central axis that extends in one direction a housing that includes a first housing portion housing the motor and that is capable of storing oil, a liquid cooling portion disposed in thermal contact with an inverter electrically coupled to the motor, the liquid cooling portion including a refrigerant liquid flowing therein, and a pipe portion connected to the liquid cooling portion, the refrigerant liquid inside the liquid cooling portion flowing in the pipe portion. The pipe portion extends inside the housing.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A Z-axis direction illustrated as appropriate in each of the drawings is a vertical direction Z in which a positive side is the upper side and a negative side is the lower side. A Y-axis direction is a direction orthogonal to the Z-axis direction. An X-axis direction is a direction orthogonal to both the Z-axis direction and the Y-axis direction. In the following description, the Y-axis direction is merely referred to as "a first direction Y", and the negative side in the Y-axis direction is referred to as "a first direction first side" and the positive side in the Y-axis direction is referred to as "a first direction second side".

Furthermore, the X-axis direction is one direction in which a first central axis J1, which is illustrated as appropriate in each drawing, extends. In other words, an axial direction of the first central axis J1 is a direction orthogonal to both the vertical direction Z and the first direction Y. In the following description, the X-axis direction is merely referred to as "an axial direction X", and the negative side in the X-axis direction is referred to as "an axial direction first side" and the positive side in the X-axis direction is referred to as "an axial direction second side". Furthermore, a radial direction having the first central axis J1 as the center is merely referred to as "a radial direction" and a circumferential direction about the first central axis J1 is merely referred to as "a circumferential direction".

Note that the vertical direction, the left side, and the right side are merely terms for describing the positional relationship of the members, and the actual dispositional relationship and the like may be a dispositional relationship and the like that is different from the dispositional relationship and the like that is depicted by the above terms.

First Embodiment

Figure 1:
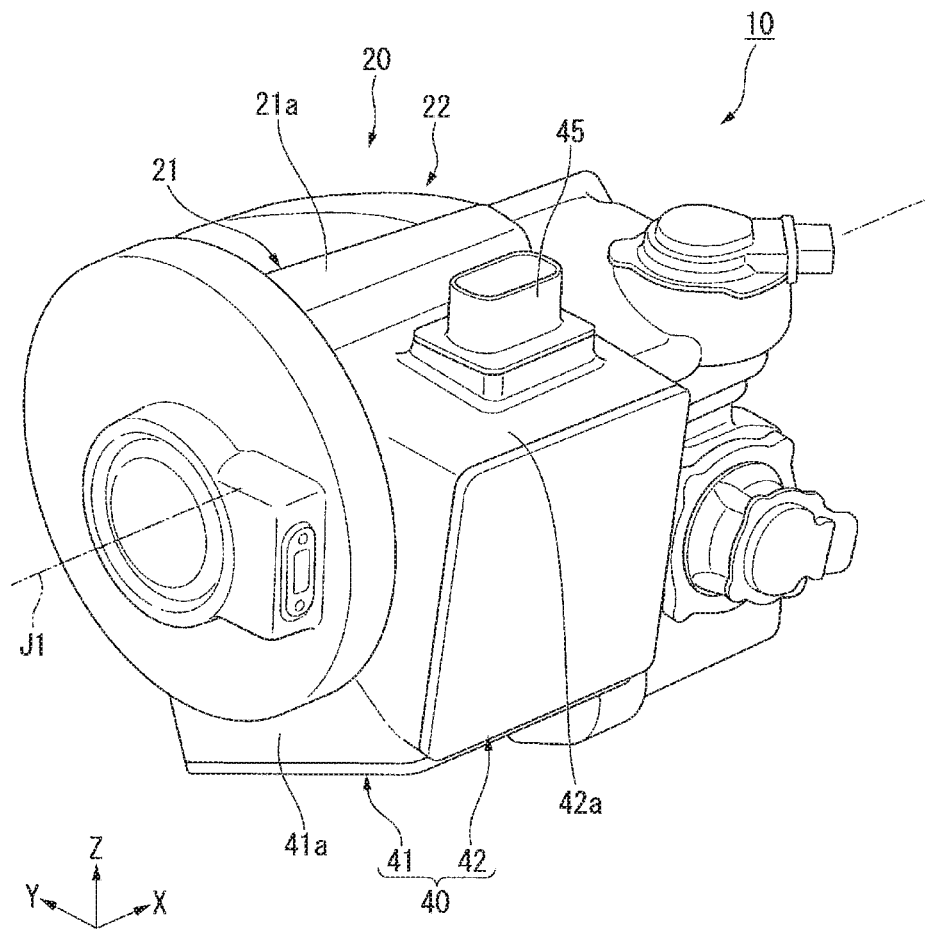
FIG. 1 is a perspective view illustrating a drive apparatus of a first example embodiment of the present disclosure.
Figure 2:
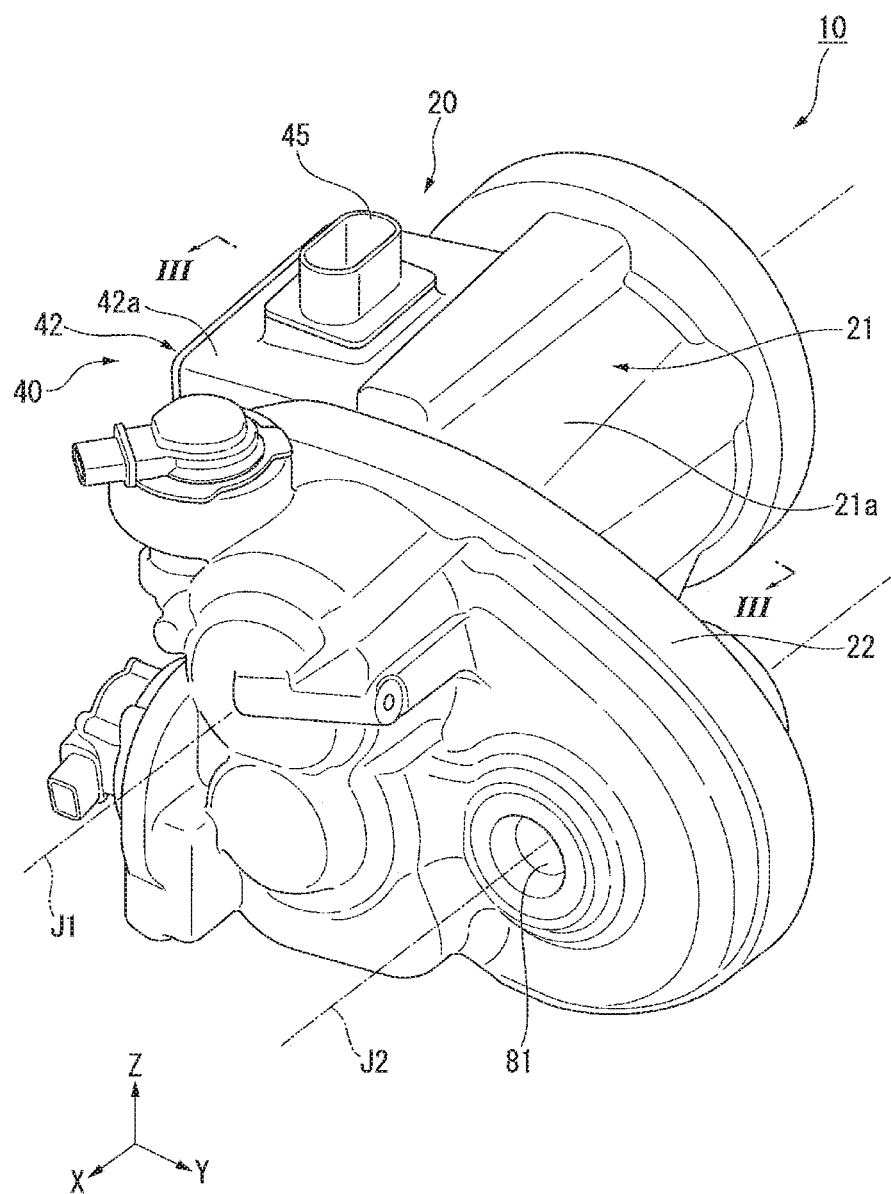
FIG. 2 is a perspective view illustrating the drive apparatus of the first example embodiment of the present disclosure.
Figure 3:
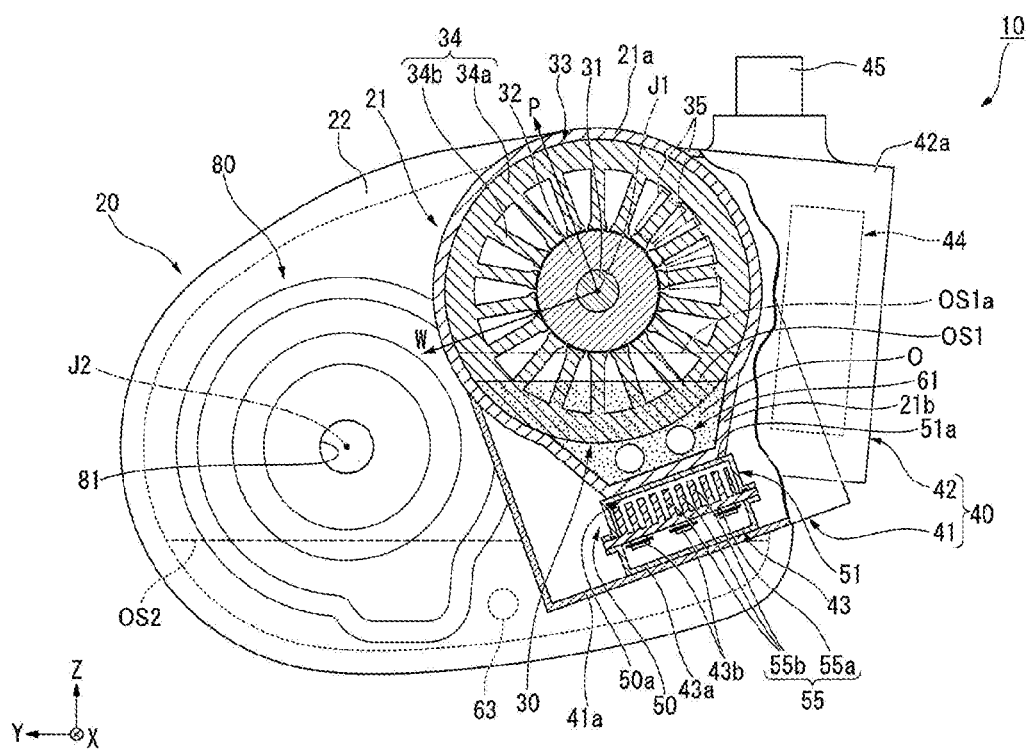
FIG. 3 is a drawing illustrating the drive apparatus of the first example embodiment of the present disclosure and is a partial cross-sectional view taken along line III-III in FIG. 2.

As illustrated in FIGS. 1 to 4, a drive apparatus 10 of the present embodiment includes a housing 20, a motor 30, an inverter unit 40, bus bars 70, a liquid cooling portion 50, pipe portions 61, 62, and 63, and a differential gear 80. The housing houses the motor 30 and the differential gear 80. As illustrated in FIG. 3, the housing 20 includes a first housing portion 21 and a second housing portion 22.

The first housing portion 21 houses the motor 30. The first housing portion 21 includes a cylindrical portion 21a and a protruding portion 21b. The cylindrical portion 21a has a substantially cylindrical shape that extends in the axial direction X. The protruding portion 21b protrudes downwards and is slightly inclined towards the first direction first side in FIG. 3 from the cylindrical portion 21a. A sectional shape of the protruding portion 21b orthogonal to the axial direction X is a trapezoidal shape in which the width thereof becomes smaller as the trapezoidal shape becomes distanced away from the cylindrical portion 21a.

In the following description, a direction parallel to the direction in which the protruding portion 21b protrudes is referred to as a protrusion direction P and is depicted as a P-axis direction in each of the drawings. The protrusion direction P is a direction slightly inclined against the vertical direction Z towards the first direction second side. Furthermore, a direction orthogonal to both the protrusion direction P and the axial direction X is referred to as a width direction W and is depicted as a W-axis direction in each of the drawings. The width direction W is a direction inclined slightly downwards against the first direction Y. Furthermore, the positive side of the protrusion direction P is referred to as a protrusion direction upper side and the negative side of the protrusion direction P is referred to as a protrusion direction lower side.

Figure 4:
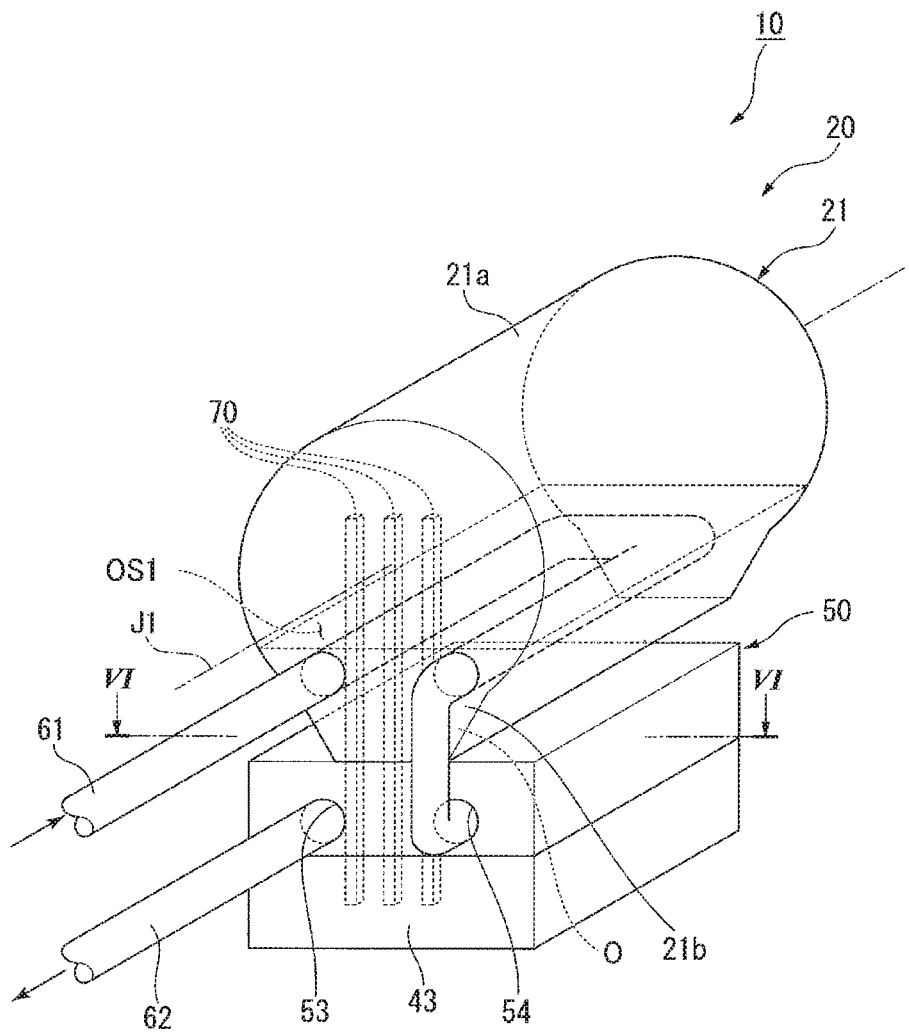
FIG. 4 is a perspective view schematically illustrating a portion of the drive apparatus of the first example embodiment of the present disclosure.

Note that in the drawings that illustrate the protrusion direction P as an up-down direction such as, for example, FIG. 4 and the like, an oil surface OS1 of oil O is schematically depicted as a state in which the protrusion direction P is parallel to the vertical direction Z. In other words, in the drawings that illustrate the protrusion direction P as the up-down direction, the oil surface OS1 of the oil O is depicted as a surface orthogonal to the protrusion direction P.

The second housing portion 22 houses the differential gear 80. As illustrated in FIGS. 1 and 2, the second housing portion 22 is disposed on the axial direction second side of the first housing portion 21. As illustrated in FIGS. 2 and 3, the second housing portion 22 extends in the first direction Y and protrudes on the first direction second side with respect to the first housing portion 21. Although not shown, an inner portion of the first housing portion 21 and an inner portion of the second housing portion 22 are connected by a connection portion between the first housing portion 21 and the second housing portion 22, in other words, are connected at an end portion of the first housing portion 21 on the axial direction second side. A lower end portion of the second housing portion 22 is disposed below a lower end portion of the first housing portion 21.

As illustrated in FIG. 3, the housing 20 is capable of storing the oil O. In the present embodiment, each of the first housing portion 21 and the second housing portion 22 is capable of storing oil O. In FIG. 3, the oil surface OS1 of the oil O stored in the first housing portion 21 is positioned above an oil surface OS2 of the oil O stored in the second housing portion 22.

The motor 30 includes a motor shaft 31 disposed along the first central axis J1 extending in one direction, that is, the axial direction X, a rotor core 32, and a stator 33. The rotor core 32 is fixed to the motor shaft 31. The rotor core 32 has an annular shape fixed on an outer peripheral surface of the motor shaft 31. The rotor core 32 is disposed above the oil surface OS1 of the oil O stored in the first housing portion 21. Accordingly, the rotor core 32 can be prevented from being soaked in the oil O stored in the first housing portion 21. With the above, the oil O can be prevented from being a rotational resistance of the rotor core 32 when the rotor core 32 rotates.

In the present embodiment, the upper limit of the oil surface OS1 of the oil O in the first housing portion 21 is an oil surface upper limit OS1a indicated by a two-dot chain line illustrated in FIG. 3, for example. The oil surface upper limit OS1a is in contact with a lower edge of the rotor core 32. For example, when the drive apparatus 10 is driven and the differential gear 80 is rotated, the oil O stored in the second housing portion 22 is stirred upwards with the gear of the differential gear 80 and flows into the first housing portion 21. With the above, the amount of oil O stored in the first housing portion 21 is increased and the oil surface OS1 of the oil O stored in the first housing portion 21 is risen. Even in such a case as well, in the present embodiment, the oil surface OS1 of the oil O does not rise above the oil surface upper limit OS1a.

The stator 33 opposes the rotor core 32 in the radial direction with a gap in between. The stator 33 surrounds a radial direction outer side of the rotor core 32. The stator 33 includes a stator core 34 and a plurality of coils 35. The stator core 34 includes an annular-shaped core back 34a, and a plurality of teeth 34b extending inwardly in the radial direction from the core back 34a. The core back 34a is fixed to a radial direction inner lateral surface of the first housing portion 21. The plurality of coils 35 are mounted in the stator core 34. More specifically, the plurality of coils 35 are each mounted on a corresponding one of the plurality of teeth 34b.

The inverter unit 40 is electrically coupled to the motor 30. The inverter unit 40 controls the electric current fed to the motor 30. As illustrated in FIGS. 1 and 2, the inverter unit 40 is fixed to an outer lateral surface of the housing 20. As illustrated in FIG. 1, the inverter unit 40 includes a first unit 41 and a second unit 42. As illustrated in FIG. 3, the first unit 41 is fixed to a lower portion of the first housing portion 21. The first unit 41 includes a first inverter case 41a and a first inverter portion 43. In other words, the inverter unit 40 includes the first inverter portion 43.

As illustrated in FIGS. 1 and 3, the first inverter case 41a has a substantially cubic box shape. As illustrated in FIG. 3, the first inverter case 41a is fixed to a radial direction outer lateral surface of the first housing portion 21 and extends towards the protrusion direction lower side from the first housing portion 21. The lower portion of the first housing portion 21 is housed inside the first inverter case 41a. In more detail, a portion of the cylindrical portion 21a on the protrusion direction lower side and the protruding portion 21b are housed inside the first inverter case 41a.

The first inverter portion 43 is housed inside the first inverter case 41a. The first inverter portion 43 is installed on a bottom surface of the first inverter case 41a. The first inverter portion 43 includes a rectangular parallelepiped box-shaped case 43a and a plurality of power devices 43b housed inside the case 43a. The case 43a is open on the protrusion direction upper side. An opening of the case 43a is closed by a heat sink described later. The power devices 43b are attached to a surface of the heat sink 55 on the protrusion direction lower side. A heat generating amount of the power devices 43b is relatively large and, for example, is the largest among the elements included in the inverter unit 40.

The second unit 42 includes a second inverter case 42a, a second inverter portion 44, and a connector portion 45. In other words, the inverter unit 40 includes the second inverter portion 44. As illustrated in FIG. 1, the second inverter case 42a has a substantially cubic box shape. The second inverter case 42a is fixed to the radial direction outer lateral surface of the first housing portion 21 and extends substantially towards the first direction first side from the first housing portion 21. An edge portion of the first housing portion 21 on the first direction first side is housed inside the second inverter case 42a. A lower end portion of the second inverter case 42a is connected to an edge portion of the first inverter case 41a on the first direction first side. An inner portion of the second inverter case 42a is connected to an inner portion of the first inverter case 41a at a portion connected to the first inverter case 41a.

As illustrated in FIG. 3, the second inverter portion 44 is housed inside the second inverter case 42a. The second inverter portion 44 is, in the first direction Y orthogonal to the vertical direction Z, disposed on the first direction first side of the first housing portion 21. Although not shown, the second inverter portion 44 is electrically coupled to the first inverter portion 43. In the present embodiment, elements included in the second inverter portion 44 are elements in which heat generating amounts thereof are relatively small or are elements that do not generate heat.

The connector portion 45 protrudes upwards from an upper surface of the second inverter case 42a. An external power supply (not shown) is coupled to the connector portion 45. Power is fed to the first inverter portion 43 and the second inverter portion through the external power supply coupled to the connector portion 45.

As illustrated in FIG. 4, the bus bars 70 each have a rod shape extending in the protrusion direction P. End portions of the bus bars 70 on the protrusion direction lower side are electrically coupled to the first inverter portion 43. The bus bars 70 extend from the first inverter portion 43 towards the protrusion direction upper side and pass inside the housing 20. The bus bars 70 are provided in plural numbers and are aligned in the width direction W. Three bus bars 70 are, for example, provided in FIG. 4.

Figure 5:
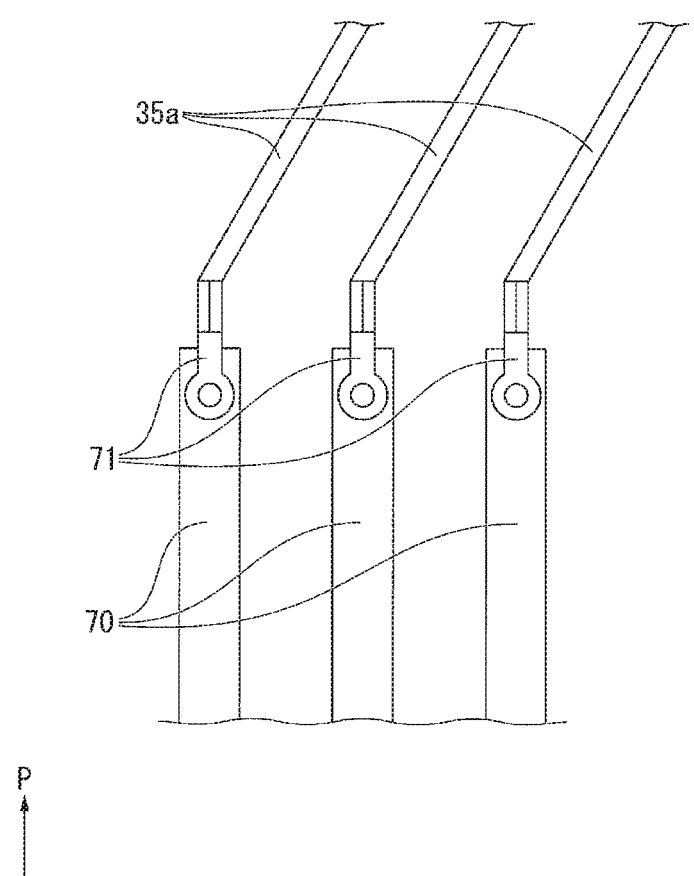
FIG. 5 is a drawing illustrating portions of bus bars of the first example embodiment of the present disclosure.

As illustrated in FIG. 5, crimped terminals 71 are fixed to the end portions of the bus bars 70 on the protrusion direction upper side. The crimped terminals 71 are fixed to the bus bars 70 by being fastened with screws, for example. Note that the crimped terminals 71 may be fixed to the bus bars 70 by welding or the like. Pieces of conducting wire 35a are coupled to the crimped terminals 71. The pieces of conducting wire 35a are end portions of pieces of conducting wire constituting the coils 35. With the above, the bus bars 70 are coupled to the coils 35 through the crimped terminals 71 and electrically couple the inverter unit 40 and the motor 30 to each other. Note that the pieces of conducting wire 35a may be other wiring members electrically coupled to the coils 35.

As illustrated in FIG. 4, the end portions of the bus bars 70 on the protrusion direction upper side are disposed on the protrusion direction upper side with respect to the oil surface OS1 of the oil O. With the above, the crimped terminals 71 are disposed above the oil surface OS1 of the oil O stored in the first housing portion 21, in other words, are disposed above the oil surface of the oil O stored in the housing 20. Accordingly, even when vibration is applied to the drive apparatus 10 and the oil O stored in the first housing portion 21 is agitated, for example, the crimped terminals 71 are not easily affected by the oil O. With the above, the connections between the bus bars 70 and the pieces of conducting wire 35a can be prevented from being disconnected.

Figure 6:
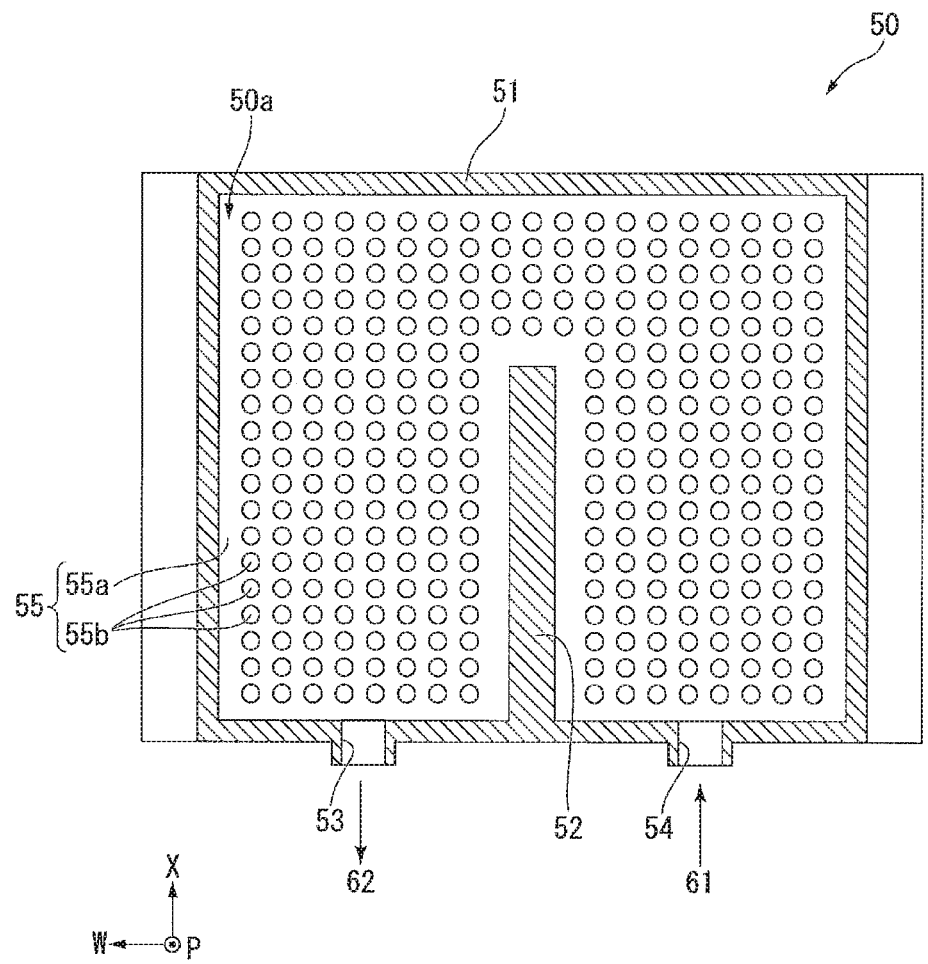
FIG. 6 is a drawing illustrating a cooling portion of the first example embodiment of the present disclosure in is a cross-sectional view taken along line VI-VI in FIG. 4.

The liquid cooling portion 50 cools the inverter unit 40. As illustrated in FIG. 3, the liquid cooling portion 50 in the present embodiment is housed inside the first inverter case 41a. The liquid cooling portion 50 is fixed to the lower end portion of the first housing portion 21. The liquid cooling portion 50 is disposed below the rotor core 32. As illustrated in FIG. 6, the liquid cooling portion 50 includes a case 51, the heat sink 55, and a wall portion 52. As illustrated in FIG. 3, the case 51 has a rectangular parallelepiped box shape that is open on the protrusion direction lower side. An opening of the case 51 on the protrusion direction lower side is closed by the heat sink 55.

The case 51 includes a plate-shaped top plate portion 51a orthogonal to the protrusion direction P. The top plate portion 51a opposes the heat sink 55 in the protrusion direction P with a gap in between. The top plate portion 51a is in thermal contact with and is fixed to a surface of the protruding portion 21b on the protrusion direction lower side. The protruding portion 21b in the present embodiment is equivalent to a contact portion with which the liquid cooling portion 50 is in thermal contact. In other words, the housing 20 includes the protruding portion 21b serving as a contact portion with which the liquid cooling portion 50 is in thermal contact.

Note that in the present specification, any objects that are "in thermal contact" with each other includes a case in which the objects are directly in contact with each other and a case in which the objects are in contact with each other through a heat transfer member. The heat transfer member includes, for example, silicon, a compound, thermal tape, grease, or the like.

The heat sink 55 includes a bottom plate portion 55a and a plurality of fins 55b. The bottom plate portion 55a has a plate shape orthogonal to the protrusion direction P. A surface of the bottom plate portion 55a on the protrusion direction lower side is a surface of the liquid cooling portion 50 on the protrusion direction lower side. The bottom plate portion 55a closes the opening of the case 51 on the protrusion direction lower side and also closes the opening of the case 43a on the protrusion direction upper side. In other words, the bottom plate portion 55a partitions an inner portion of the liquid cooling portion 50 and an inner portion of the first inverter portion 43 from each other in the protrusion direction P.

The case 43a and the power devices 43b are fixed to the surface of the bottom plate portion 55a on the protrusion direction lower side. In other words, the first inverter portion 43 is fixed to the bottom plate portion 55a. With the above, the liquid cooling portion 50 is disposed so as to be in thermal contact with the inverter unit 40. The plurality of fins 55b each have a rod shape projecting towards the protrusion direction upper side from a surface of the bottom plate portion 55a on the protrusion direction upper side. End portions of the fins 55b on the protrusion direction upper side are disposed at positions separated towards the protrusion direction lower side from the top plate portion 51a of the case 51. As illustrated in FIG. 6, the plurality of fins 55b are disposed so as to be aligned in the width direction W and the axial direction X.

The wall portion 52 extends towards the protrusion direction upper side from the surface of the bottom plate portion 55a on the protrusion direction upper side and is connected to a surface of the top plate portion 51a on the protrusion direction lower side. The wall portion 52 extends from, among inner lateral surfaces of the case 51, a surface on the axial direction first side towards the axial direction second side. A flow passage 50a surrounded by the case 51, the heat sink 55, and the wall portion is formed inside the liquid cooling portion 50. The flow passage 50a has a U-shape open towards the axial direction first side.

The liquid cooling portion 50 includes a first inflow and outflow port 53 and a second inflow and outflow port 54. The first inflow and outflow port 53 and the second inflow and outflow port 54 are provided in a surface of the case 51 on the axial direction first side and so as to be separated from each other in the width direction W. The first inflow and outflow port 53 and the second inflow and outflow port 54 each connect a portion external to the liquid cooling portion 50 and the flow passage 50a to each other. The first inflow and outflow port 53 is connected to a first end of the flow passage 50a. The second inflow and outflow port 54 is connected to a second end of the flow passage 50a. The refrigerant liquid flows into the flow passage 50a of the present embodiment through the second inflow and outflow port 54. The refrigerant liquid that has flowed inside the flow passage 50a flows out through the first inflow and outflow port 53. The refrigerant liquid flows inside the liquid cooling portion 50 in the above manner. The refrigerant liquid is not particularly limited and is water, for example.

By having the refrigerant liquid flow in the flow passage 50a, components that are in thermal contact with the liquid cooling portion 50 can be cooled. In the present embodiment, since the liquid cooling portion 50 is in thermal contact with the inverter unit 40 and the housing 20, the inverter unit 40 and the housing 20 can be cooled with the liquid cooling portion 50. Note that as illustrated in FIG. 3, at least a portion of the protruding portion 21b with which the liquid cooling portion 50 in the housing 20 is in thermal contact is disposed below the oil surface OS1 in the vertical direction Z. In other words, at least a portion of the protruding portion 21b serving as the contact portion is disposed below the oil surface OS1. With the above, at least a portion of an inner lateral surface of the protruding portion 21b is in contact with the oil O stored in the first housing portion 21. Accordingly, by cooling the protruding portion 21b with the liquid cooling portion 50, the oil O stored in the housing 20 can be cooled.

In the present embodiment, the oil O in a stored state can be cooled by the liquid cooling portion 50 in the above manner; accordingly, compared to a case in which a cooling device is disposed in the flow passage through which the oil O flows, the oil O can be sufficiently cooled easily. Furthermore, since the liquid cooling portion 50 that cools the inverter unit 40 that adjusts the electric current supplied to the motor 30 can be used, an increase in the size of the overall drive apparatus 10 can be suppressed compared with a case in which a cooling device that cools the oil O is provided separately. According to the present embodiment, the drive apparatus 10 having a structure that is capable of sufficiently cooling the oil O for cooling and that is capable of suppressing an increase in the size thereof can be obtained with the above. Since the oil O can be cooled sufficiently, the motor 30 can be cooled in a suitable manner with the oil O. Furthermore, since the number of parts of the drive apparatus 10 can be small, the labor and the cost of assembling the drive apparatus 10 can be reduced.

Note that in the present specification, it is only sufficient that in "at least a portion of the contact portion being disposed below the oil surface of the oil", at least a portion of the contact portion is disposed below the oil surface of the oil in at least one of the modes and positions among the modes and positions in which the drive apparatus is used. In other words, for example, in a state illustrated in FIG. 3, if at least a portion of the protruding portion 21b is disposed below the oil surface OS1, then, when the drive apparatus 10 is positioned so as to be more inclined in the circumferential direction than the position illustrated in FIG. 3, the entire protruding portion 21b can be disposed above the oil surface OS1. Furthermore, also in a case in which the oil surface OS1 changes in the vertical direction Z while the position of the drive apparatus 10 does not change, it is only sufficient that at least a portion of the protruding portion 21b is disposed below the oil surface OS1 in a range in the vertical direction Z in which the oil surface OS1 changes.

By providing the plurality of fins 55b in the present embodiment, a surface area of the heat sink 55 in contact with the refrigerant liquid can be increased. Accordingly, the heat of the power devices 43b fixed to the bottom plate portion 55a can be released through the plurality of fins 55b to the refrigerant liquid flowing through the flow passage 50a. With the above, the first inverter portion 43 can be cooled further readily with the liquid cooling portion 50.

At least a portion of the protruding portion 21b that is the contact portion in the present embodiment is disposed below the rotor core 32. Accordingly, even if the oil surface OS1 is set below the rotor core 32 in the manner described above, at least a portion of the inner lateral surface of the protruding portion 21b can be made to be in contact with the oil O. Accordingly, the oil O stored inside the first housing portion 21 can be sufficiently cooled by cooling the protruding portion 21b with the liquid cooling portion 50 while preventing the oil O from becoming a rotational resistance of the rotor core 32.

Furthermore, in the present embodiment, the protruding portion 21b that is the contact portion is the lower portion of the first housing portion 21. Accordingly, the oil O stored in the first housing portion 21 can be cooled with the liquid cooling portion 50. With the above, the motor 30 can be efficiently cooled with the oil O. Note that in the present specification, "the lower portion of the first housing portion" includes a portion that is disposed below the center of the first housing portion in the vertical direction Z when the drive apparatus is disposed at a position during ordinary use.

Furthermore, in the present embodiment, a portion of the inverter unit 40 that is in thermal contact with the liquid cooling portion 50 is the first inverter portion 43. The first inverter portion 43 is disposed so as to be in thermal contact with and below the liquid cooling portion 50. Accordingly, the housing 20 and the first inverter portion 43 can easily interpose the liquid cooling portion 50 therebetween in the vertical direction Z, and both the housing 20 and the first inverter portion 43 can easily be in thermal contact with the liquid cooling portion 50. Furthermore, for example, as in the present embodiment, by mounting the power devices 43b, which have a relatively large heat generating amount, in the first inverter portion 43, the portions in the inverter unit 40 that particularly generate heat can be readily cooled with the liquid cooling portion 50.

Furthermore, in the present embodiment, the inverter unit 40 includes the second inverter portion 44 disposed on the first direction first side of the first housing portion 21. By disposing the first inverter portion 43 below and the second inverter portion 44 on the first direction first side of the first housing portion 21 in the above manner, compared to a case in which the entire inverter unit 40 is disposed below or on the first direction first side of the first housing portion 21, a reduction in the size of the overall drive apparatus 10 is facilitated. Furthermore, among the elements of the inverter unit 40, by gathering and installing the elements that have a relatively large heat generating amount in the first inverter portion 43, the inverter unit 40 can be cooled efficiently even when the inverter unit 40 is split into two inverter portions. As described above, the present embodiment can suppress the drive apparatus 10 from becoming large in size while efficiently cooling the inverter unit 40 with the liquid cooling portion 50.

The pipe portions 61 and 62 illustrated in FIG. 4 are connected to the liquid cooling portion 50 and the refrigerant liquid inside the liquid cooling portion 50 flows there-through. A portion of the pipe portion 61 is disposed inside the first housing portion 21. In more detail, as illustrated in FIG. 4, the pipe portion 61 is inserted inside the first housing portion 21 through a surface of the first housing portion 21 on the axial direction first side, is bent in a U-shape inside the first housing portion 21, and is protruded to a portion external to the first housing portion 21 through the surface of the first housing portion 21 on the axial direction first side. With the above, the pipe portion 61 passes inside the housing 20. Accordingly, the inner portion of the housing 20 can be cooled with the pipe portion 61 and the oil O stored in the housing 20 is readily cooled.

In the present embodiment, the oil O in a stored state can be cooled by the pipe portion 61 in the above manner; accordingly, compared to a case in which a cooling device is disposed in the flow passage through which the oil O flows, the oil O can be sufficiently cooled easily. Furthermore, since the pipe portion 61 connected to a liquid cooling portion 50 that cools the inverter unit 40 that adjusts the electric current supplied to the motor 30 can be used, an increase in the size of the overall drive apparatus 10 can be suppressed compared with a case in which a cooling device that cools the oil O is provided separately. According to the present embodiment, the drive apparatus 10 having a structure that is capable of sufficiently cooling the oil O for cooling and that is capable of suppressing an increase in the size thereof can be obtained with the above. Furthermore, in the present embodiment, as described above, since the liquid cooling portion 50 can also cool the oil O stored in the housing 20, the oil O can be cooled further.

The pipe portion 61 passes through a vertical direction lower side area inside the housing 20. Accordingly, it is easier to pass the pipe portion 61 through the oil O stored inside and on the lower side of the housing 20 in the vertical direction Z. With the above, the oil O stored in the housing 20 can be cooled further readily with the pipe portion 61.

Note that in the present specification, "the vertical direction lower side area inside the housing" is any position in the inner portion of the housing below the center in the vertical direction Z. In other words, for example, in the first housing portion 21, a portion inside the first housing portion 21 positioned below the center thereof in the vertical direction Z is the vertical direction lower side area inside the housing. Furthermore, in the second housing portion 22, a portion inside the second housing portion 22 positioned below the center thereof in the vertical direction Z is the vertical direction lower side area inside the housing. In other words, the position of the vertical direction lower side area inside the housing in the vertical direction Z is, in some cases, different depending on the housing portion, for example.

In the present embodiment, the pipe portion 61 passes through the vertical direction lower side area inside the first housing portion 21. Accordingly, the pipe portion 61 can be readily passed into the housing 20 at a portion below the oil surface OS1, and the pipe portion 61 can cool the oil O stored inside the first housing portion 21 in a suitable manner. At least a portion of the pipe portion 61 disposed inside the hosing 20 is disposed below the oil surface of the oil O stored in the housing 20, in other words, in the present embodiment, is disposed below the oil surface OS1. Accordingly, the pipe portion 61 can be in contact with the oil O and the oil O can be cooled further readily with the refrigerant liquid flowing through the pipe portion 61.

In the present embodiment, the entire portion of the pipe portion 61 disposed inside the housing 20 is disposed below the oil surface OS1 and passes inside the oil O. As illustrated in FIG. 3, the pipe portion 61 disposed inside the housing 20 is disposed below the rotor core 32. In the present embodiment, the pipe portion 61 passes through an inner portion of a protruding portion 21b.

As illustrated in FIG. 4, the pipe portion 61 protruding to a portion external to the first housing portion 21 from the inside of the first housing portion 21 is connected to the second inflow and outflow port 54 of the liquid cooling portion 50. With the above, the refrigerant liquid flowing inside the pipe portion 61 flows into the liquid cooling portion 50, in other words, into the flow passage 50a, through the second inflow and outflow port 54. The pipe portion 62 is connected to the first inflow and outflow port 53 of the liquid cooling portion 50. With the above, the refrigerant liquid inside the liquid cooling portion 50, in other words, inside the flow passage 50a, flows out into the pipe portion 62 through the first inflow and outflow port 53.

The pipe portion 63 illustrated in FIG. 3 is connected to the pipe portion 61 or the pipe portion 62 and is connected to the liquid cooling portion 50 through the pipe portion 61 or the pipe portion 62. The pipe portion 63 passes inside the housing 20. In more detail, the pipe portion 63 passes through the vertical direction lower side area inside the second housing portion 22. Accordingly, the oil O stored in the second housing portion 22 is readily cooled with the pipe portion 63. At least a portion of the pipe portion 63 is disposed below the oil surface OS2 of the oil O stored in the second housing portion 22.

Although not shown, the pipe portions 61 and 62 are drawn into the second inverter case 42a from inside the first inverter case 41a and is drawn out to a portion external to the drive apparatus 10 from the second inverter case 42a. The pipe portions 61 and 62 drawn out to the portion external to the drive apparatus 10 is connected to a pump (not shown). The pump circulates the refrigerant liquid through the pipe portion 61, the flow passage 50a, and the pipe portion 62 in that order. In the present embodiment, for example, in the course of the above circulation, the refrigerant liquid flows in the pipe portion 63 connected to the pipe portion 61 or the pipe portion 62. Furthermore, the pipe portion 62 is connected to a radiator (not shown) at a portion external to the drive apparatus 10. The radiator cools the refrigerant liquid inside the pipe portion 62. With the above, the heat absorbed by the oil O stored in the inverter unit 40 and the housing 20 can be released with the refrigerant liquid.

Driving force from the motor 30 is transmitted to the differential gear 80 illustrated in FIG. 3 through the motor shaft 31. In more detail, the differential gear 80 is coupled to the motor shaft 31 through a deceleration mechanism, and a decelerated rotation of the motor shaft 31 is transmitted. The differential gear 80 includes a connection hole portion 81 having a second central axis J2 at the center. The second central axis J2 is parallel to the first central axis J1 and, in the first direction Y, is disposed on the opposite side of the second inverter portion 44 with respect to the first central axis J1, in other words, is disposed on the first direction second side.

An output shaft disposed along the second central axis J2, for example, is connected to the connection hole portion 81. The differential gear 80 is capable of outputting the driving force transmitted from the motor shaft 31 through the deceleration mechanism to an output shaft coupled to the connection hole portion 81. In other words, the differential gear 80 is capable of outputting the driving force about the second central axis J2 to the output shaft. The output shaft is, for example, an axle of a vehicle.

In the present embodiment, the second central axis J2 is disposed at a position that interposes the first central axis J1 with the second inverter portion 44 in the first direction Y. Accordingly, the second inverter portion 44, in other words, the second unit 42, can be prevented from being disposed at a position that overlaps the connection hole portion 81 in the axial direction X. With the above, the output shaft can be connected to the connection hole portion 81 easily.

The present invention is not limited to the embodiment described above and other configurations can be adopted. Note that in the description hereinafter, description of components that are similar to those of the embodiment described above may be omitted by, for example, appropriately attaching the same reference numerals thereto.

The entire inverter unit 40 may be disposed below the first housing portion 21 or on either side of the first housing portion 21 in the first direction Y. In such a case, the first unit 41 and the second unit 42 may be unified as a single unit. A portion of the liquid cooling portion 50 may be disposed above the oil surface OS1. Another liquid cooling portion that cools the second inverter portion 44 may be provided in the second unit 42. In such a case, the another liquid cooling portion may be connected to the liquid cooling portion 50 through the pipe portions 61 and 62, for example. Furthermore, the shapes of the plurality of fins 55b may be shapes formed along the flow of the refrigerant liquid flowing in the flow passage 50a. The bus bars 70 and the pieces of conducting wire 35a may be directly fixed to each other without the crimped terminals 71 in between. The bus bars 70 and the pieces of conducting wire 35a may be, for example, directly fixed to each other with screws or may be directly fixed to each other by welding.

Figure 7:
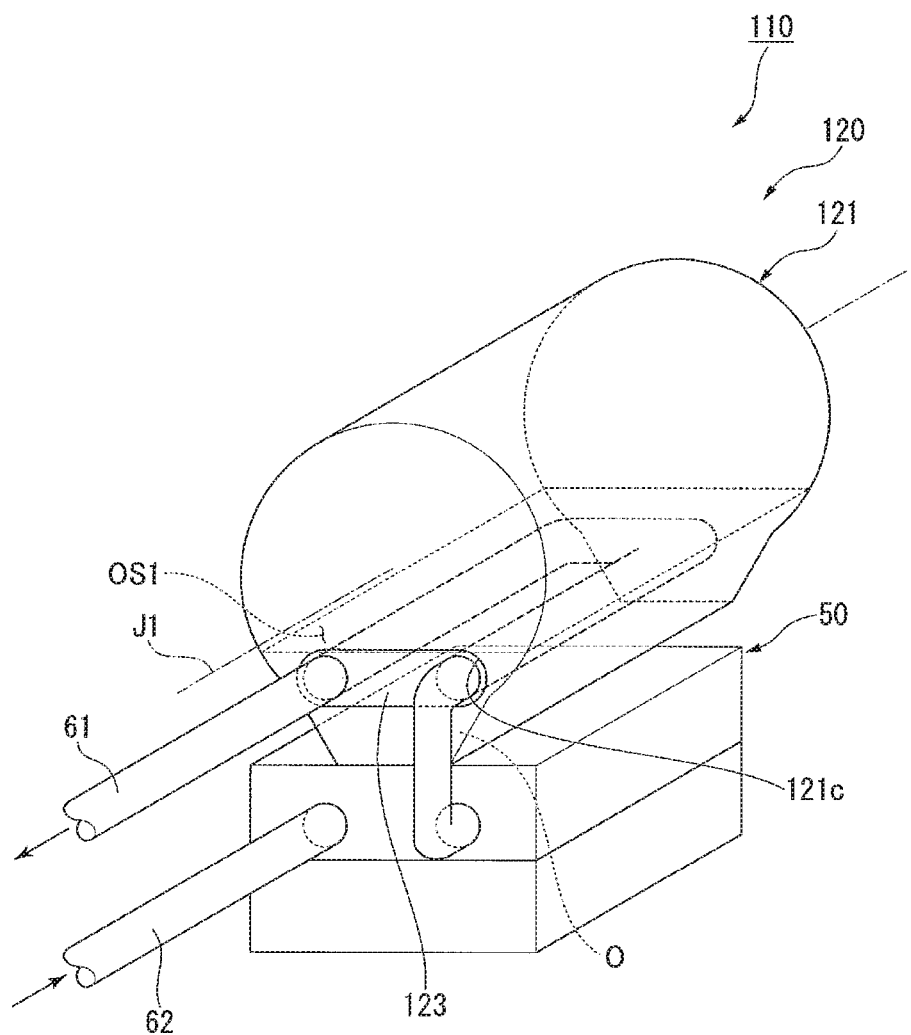
FIG. 7 is a perspective view schematically illustrating a portion of a drive apparatus that is a modification of the first example embodiment of the present disclosure.

As illustrated in FIG. 7, in a drive apparatus 110 of the present modification, a first housing portion 121 of a housing 120 includes a window portion 121c. The window portion 121c is an opening portion provided in a surface of the first housing portion 121 on the axial direction first side. The window portion 121c connects an inner portion of the first housing portion 121 and a portion external to the first housing portion 121 to each other. The window portion 121c has a rounded rectangle shape extending in the width direction W.

The housing 120 includes a lid portion 123 that covers the window portion 121c. The lid portion 123 has a plate shape orthogonal to the axial direction X. The shape of the lid portion 123 viewed in the axial direction X is a rounded rectangle shape extending in the width direction W. The lid portion 123 closes the window portion 121c by being fitted into the window portion 121c. A material of the lid portion 123 is, for example, rubber or metal. A sealing member such as, for example, a formed-in-place gasket (an FIPG) is disposed between the window portion 121c and the lid portion 123. With the above, the oil O can be prevented from leaking to a portion external to the first housing portion 121 through a gap between the window portion 121c and the lid portion 123.

The lid portion 123 includes hole portions that penetrate the lid portion 123 in the axial direction X at both end portions in the width direction W. A portion of the pipe portion 61 inserted inside the first housing portion 121 from a portion external to the first housing portion 121, and a portion of the pipe portion 61 that is protruded to a portion external to the first housing portion 121 from inside the first housing portion 121 are passed through the hole portions of the lid portion 123. A sealing member such as, for example, an FIPG is disposed between each of the hole portions of the lid portion 123 and the pipe portion 61. With the above, the oil O can be prevented from leaking to a portion external to the first housing portion 121 through a gap between the hole portions of the lid portion 123 and the pipe portion 61.

According to the present modification, since the window portion 121c is provided, the pipe portion 61 is really passed into the first housing portion 121. Specifically, in a state in which the pipe portion 61 is passed through the hole portions of the lid portion 123 and in which the lid portion 123 is fixed to the pipe portion 61, a portion in the pipe portion 61 bent in a U-shape is inserted inside the first housing portion 121 through the window portion 121c. Subsequently, the pipe portion 61 is inserted towards the axial direction second side and the lid portion 123 is fitted into and fixed to the window portion 121c. With the above, a portion of the pipe portion 61 can be readily disposed inside the first housing portion 121, and the pipe portion 61 can be passed through into the first housing portion 121 in a readily manner.

In the present modification, different from the drive apparatus 10 illustrated in FIG. 4, the refrigerant liquid flows into the liquid cooling portion 50 through the pipe portion 62, and the refrigerant liquid that has flowed inside the liquid cooling portion 50 flows out through the pipe portion 61. In other words, the direction in which the refrigerant liquid flows in the pipe portions 61, 62, and 63 and the liquid cooling portion 50 in the present modification is opposite to that in the drive apparatus 10 illustrated in FIG. 4. With the above, the refrigerant liquid fed from a pump (not shown) can be made to flow inside the liquid cooling portion 50 before being made to flow inside the first housing portion 21. Accordingly, a temperature of the refrigerant liquid flowing inside the liquid cooling portion 50 can be lower and the first inverter portion 43 can be cooled in a further suitable manner.

Figure 8:
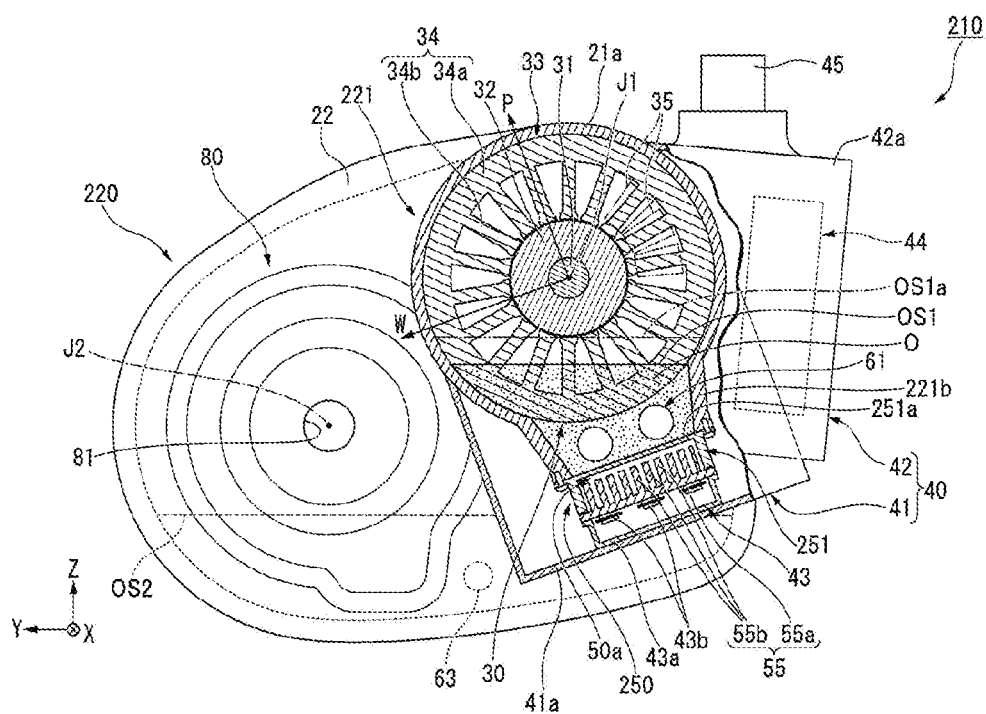
FIG. 8 is a cross-sectional view illustrating a drive apparatus of a second example embodiment of the present disclosure.

As illustrated in FIG. 8, in a drive apparatus 210 of the present embodiment, a first housing portion 221 opens towards a protrusion direction lower side. In more detail, the protruding portion 221b is open towards the protrusion direction lower side. The opening of the protruding portion 221b on the protrusion direction lower side is closed by a top plate portion 251a of a case 251 of a liquid cooling portion 250. In other words, in the present embodiment, a portion of the liquid cooling portion 250 is also a portion of a housing 220.

Note that in the present specification, "the liquid cooling portion being in thermal contact with the housing" includes a case in which the refrigerant liquid flowing inside the liquid cooling portion is capable of being in thermal contact with the housing. In the present embodiment, since the top plate portion 251a constitutes a portion of the first housing portion 221, the refrigerant liquid flowing inside the liquid cooling portion 250 is in thermal contact with the top plate portion 251a that constitute a portion of the first housing portion 221. Accordingly, the liquid cooling portion 250 is in thermal contact with the housing 220. With the above, similar to the first embodiment, since the liquid cooling portion 250 can cool the oil O stored in the housing 220, the oil O is cooled further readily. Particularly in the present embodiment, since the refrigerant liquid is directly in contact with the top plate portion 251a that constitutes a portion of the first housing portion 221 that stores the oil O, the heat of the oil O is absorbed further readily with the refrigerant liquid and the oil O is cooled further readily.

The top plate portion 251a is fixed to an end portion of the protruding portion 221b on the protrusion direction lower side with screws. Although not shown, a sealing member is disposed between the top plate portion 251a and the end portion of the protruding portion 221b on the protrusion direction lower side. The sealing member is an FIPG, for example. With the above, the oil O inside the first housing portion 221 can be prevented from leaking to a portion external to the housing 220.

Figure 9:
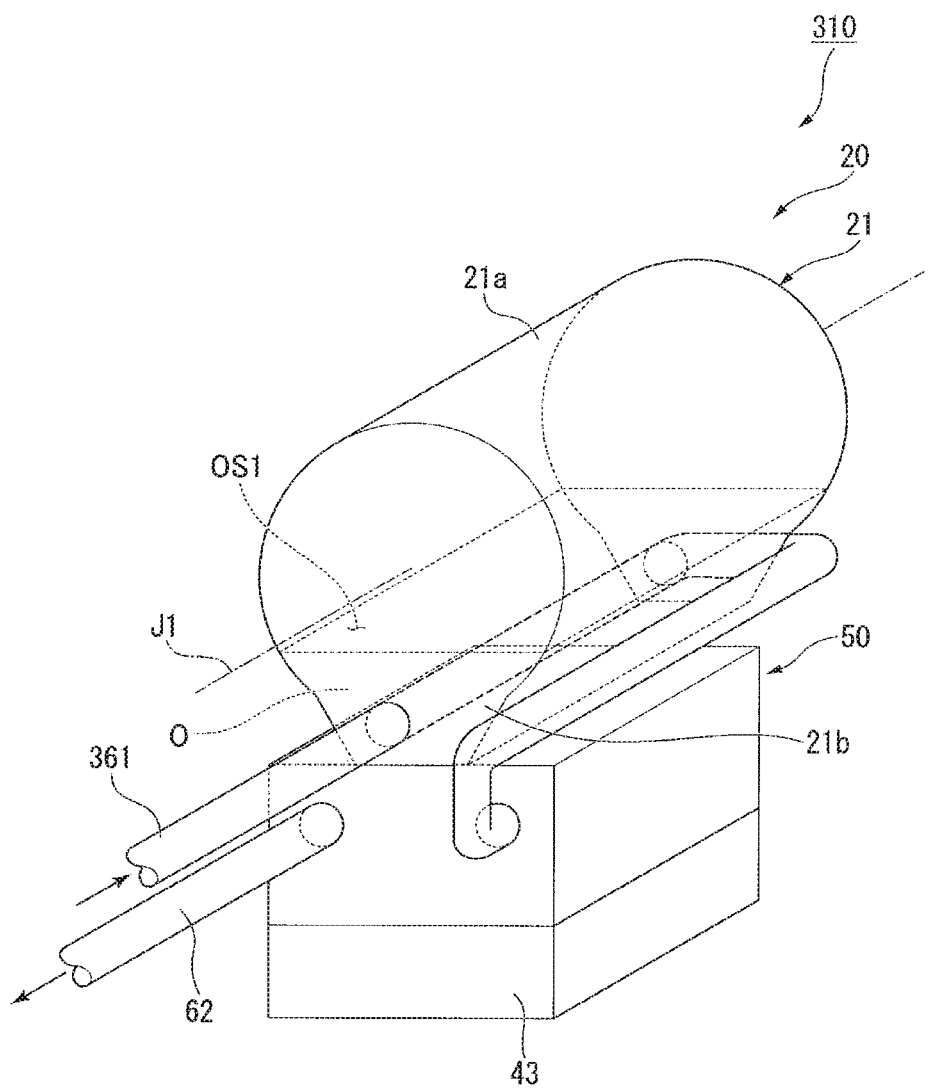
FIG. 9 is a perspective view schematically illustrating a portion of a drive apparatus of a third example embodiment of the present disclosure.

In a drive apparatus 310 of the present embodiment illustrated in FIG. 9, a pipe portion 361 extends in a U-shape open towards the axial direction first side. The pipe portion 361 is inserted inside the first housing portion 21 through a surface of the first housing portion 21 on the axial direction first side and is protruded to a portion external to the first housing portion 21 through a surface of the first housing portion 21 on the axial direction second side. The pipe portion 361 protruded from a surface of the first housing portion 21 on the axial direction second side is bent back in a U-shape, and it extended towards the axial direction first side while being in contact with a lateral surface of the protruding portion 21b on a width direction first side. With the above, the pipe portion 361 is in thermal contact with the outer lateral surfaces of the first housing portion 21, in other words, with the outer lateral surfaces of the housing 20. Accordingly, in the present embodiment, the pipe portion 361 can cool the inner portion of the housing 20 and, also, can cool the housing 20 from the outside. Accordingly, the oil O stored in the housing 20 can be cooled further.

In the present embodiment, the portions with which the pipe portion 361 is in thermal contact are the outer lateral surfaces of the protruding portion 21b. The outer lateral surfaces of the protruding portion 21b are outer lateral surfaces of the first housing portion 21 in the vertical direction lower side area. In other words, the pipe portion 361 is in thermal contact with the outer lateral surfaces of the vertical direction lower side area of the housing 20. With the above, the oil O stored in the housing 20 can be cooled further readily with the pipe portion 361.

Note that the pipe portion 361 may be in thermal contact with an outer lateral surface of the housing 20 other than that of the protruding portion 21b. For example, the pipe portion 361 may be in thermal contact with an outer lateral surface of the second housing portion 22.

Figure 10:
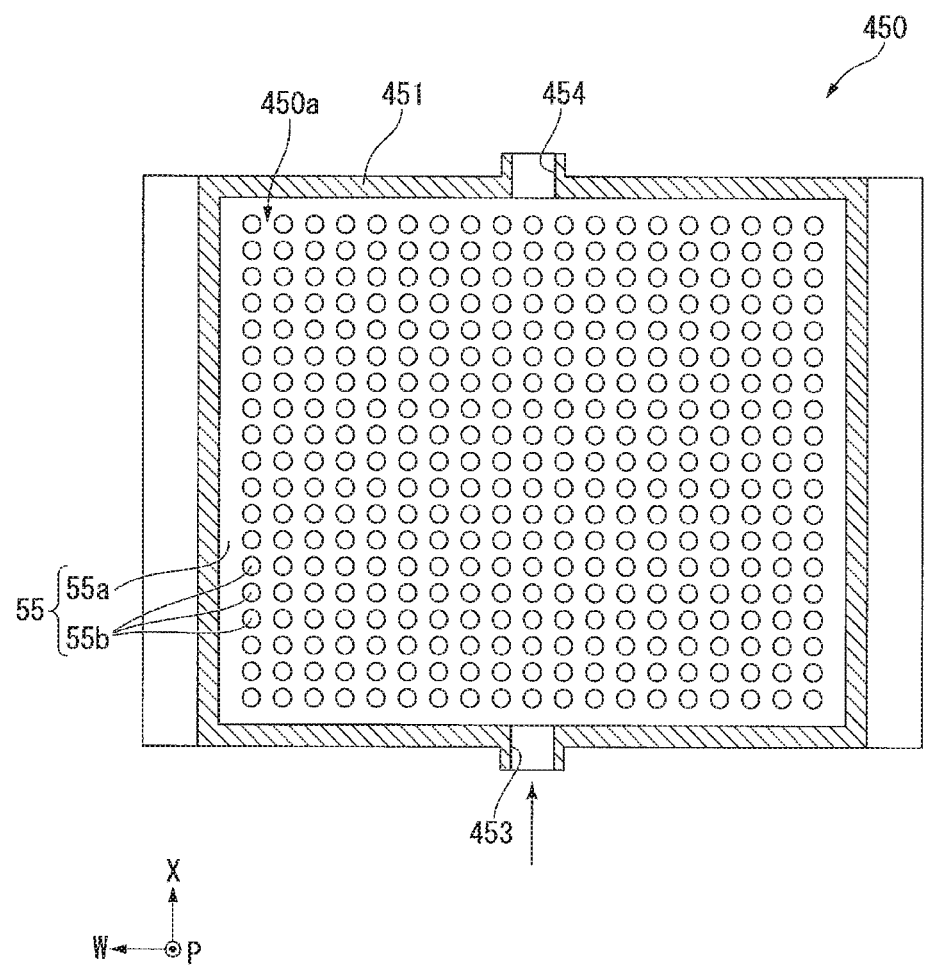
FIG. 10 is a cross-sectional view illustrating a cooling portion that is another example embodiment of the present disclosure.

In each of the embodiments described above, the inflow and outflow of the refrigerant liquid with respect to the liquid cooling portion are performed through the same surface of the liquid cooling portion in the axial direction X; however, it is not limited to the above. As in a liquid cooling portion 450 illustrated in FIG. 10, the inflow and the outflow of the refrigerant liquid with respect to the liquid cooling portion may be performed through a surface on the opposite side of the liquid cooling portion in the axial direction X. As illustrated in FIG. 10, in the liquid cooling portion 450, a first inflow and outflow port 453 is provided in a surface of a case 451 on the axial direction first side. A second inflow and outflow port 454 is provided in a surface of the case 451 on the axial direction second side. With the above, for example, the refrigerant liquid that has flowed from the axial direction first side into a flow passage 450a through the first inflow and outflow port 453 flows out of the second inflow and outflow port 454 towards the axial direction second side.

The first inflow and outflow port 453 is disposed in a surface of the case 451 on the axial direction first side and at the middle of the surface in the width direction W. The second inflow and outflow port 454 is disposed in a surface of the case 451 on the axial direction second side and at the middle of the surface in the width direction W. Note that in the liquid cooling portion 450, the refrigerant liquid may be made to flow through the second inflow and outflow port 454 to the flow passage 450a and the refrigerant liquid inside the flow passage 450a may be made to flow out through the first inflow and outflow port 453.

Furthermore, in the embodiments described above, the contact portion with which the liquid cooling portion in the housing is in thermal contact is a portion of the first housing portion; however, it is not limited to the above. The contact portion may be a portion of the second housing portion. In such a case, the liquid cooling portion is in thermal contact with and is fixed to the lower end portion of the second housing portion, for example. In other words, the contact portion of the housing with which the liquid cooling portion is in thermal contact is a lower portion of the second housing portion. With the above, the oil O stored in the second housing portion can be sufficiently cooled with the liquid cooling portion. In such a configuration, for example, an inverter unit is fixed to a surface of the liquid cooling portion on the lower side.

Furthermore, the embodiments described above is configured so that the liquid cooling portion is in thermal contact with the housing; however, it is not limited to the above. The liquid cooling portion does not have to be in thermal contact with the housing. In other words, the housing does not have to include the contact portion. In such a case, the liquid cooling portion and the inverter unit are disposed so as to be separated from the housing. Portions where the liquid cooling portion and the inverter unit are disposed are not limited in particular. In the above case as well, since the pipe portion passes inside the housing, the oil stored inside the housing can be cooled with the pipe portion.

Furthermore, the drive apparatuses in the embodiments described above may include a second liquid cooling portion that is different from the liquid cooling portion. The second liquid cooling portion is in thermal contact with the housing and cools the housing and the oil O stored in the housing. The second liquid cooling portion may be connected to the liquid cooling portion through the pipe portion, for example. The liquid cooling portion and the second liquid cooling portion may be disposed with the housing interposed therebetween. With such a configuration, since the oil O stored in the housing can be cooled by the liquid cooling portion and the second liquid cooling portion, the oil O can be cooled in a further suitable manner.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A drive apparatus comprising:
a motor that includes a motor shaft disposed along a first central axis that extends in one direction;
a housing that includes a first housing portion housing the motor;
a liquid cooling portion disposed in thermal contact with an inverter electrically coupled to the motor, the liquid cooling portion including a refrigerant liquid flowing therein; and
a pipe portion connected to the liquid cooling portion, the refrigerant liquid inside the liquid cooling portion flowing in the pipe portion; wherein
the first housing portion is capable of storing oil; and
the pipe portion extends through a space which is between an inner surface of the first housing portion and an outer surface of the motor, portions of the inner surface of the first housing portion and the outer surface of the motor being directly opposed to one another.

2. The drive apparatus according to claim 1, wherein the pipe portion passes through a vertical direction lower side area inside the housing.

3. The drive apparatus according to claim 2, wherein the pipe portion passes a vertical direction lower side area inside the first housing portion.

4. The drive apparatus according to claim 1, further comprising:
   a differential gear to which a driving force from the motor is transmitted through the motor shaft; wherein
   the housing houses the differential gear and includes a second housing portion capable of storing oil;
   the pipe portion passes a vertical direction lower side area inside the second housing portion.

5. The drive apparatus according to claim 1, wherein at least a portion of the pipe portion inside the housing is disposed below an oil surface of oil stored in the housing.

6. The drive apparatus according to claim 1, wherein the pipe portion is in thermal contact with a vertical direction lower side area of an outer lateral surface of the housing.

\* \* \* \* \*